United States Patent
Pan et al.

(10) Patent No.: US 7,510,889 B2
(45) Date of Patent: Mar. 31, 2009

(54) LIGHT EMITTING CHIP PACKAGE AND MANUFACTURING METHOD THEREOF

(75) Inventors: Yu-Tang Pan, Tainan County (TW); Shih-Wen Chou, Tainan County (TW); Men-Shew Liu, Tainan County (TW)

(73) Assignee: ChipMOS Technologies Inc., Hsinchu (TW)

( * ) Notice: Subject to any disclaimer, the term of this patent is extended or adjusted under 35 U.S.C. 154(b) by 63 days.

(21) Appl. No.: 11/762,067

(22) Filed: Jun. 13, 2007

(65) Prior Publication Data

US 2008/0093606 A1    Apr. 24, 2008

(30) Foreign Application Priority Data

Oct. 24, 2006    (TW) .............................. 95139151 A

(51) Int. Cl.
  *H01L 21/00*    (2006.01)
(52) U.S. Cl. .................... 438/26; 438/111; 438/112; 438/53; 438/64; 257/99; 257/100; 257/81; 257/82; 257/91
(58) Field of Classification Search ................. 438/111, 438/112, 26, 53, 64, 669; 257/99, 100, 81, 257/82, 91
See application file for complete search history.

(56) References Cited

U.S. PATENT DOCUMENTS

| | | | | |
|---|---|---|---|---|
| 5,194,930 A * | 3/1993 | Papathomas et al. | ......... | 257/773 |
| 5,592,025 A * | 1/1997 | Clark et al. | .................. | 257/774 |
| 6,242,932 B1 * | 6/2001 | Hembree | ..................... | 324/755 |
| 6,380,615 B1 * | 4/2002 | Park et al. | .................... | 257/686 |
| 6,383,835 B1 * | 5/2002 | Hata et al. | ..................... | 438/65 |
| 6,451,627 B1 * | 9/2002 | Coffman | ..................... | 438/111 |
| 6,534,859 B1 * | 3/2003 | Shim et al. | .................. | 257/706 |
| 6,545,332 B2 * | 4/2003 | Huang | ......................... | 257/433 |
| 6,613,606 B1 * | 9/2003 | Lee | ............................. | 438/108 |
| 6,624,523 B2 * | 9/2003 | Chao et al. | .................. | 257/796 |
| 6,630,371 B2 * | 10/2003 | Hembree | ..................... | 438/118 |
| 6,653,661 B2 * | 11/2003 | Okazaki | ...................... | 257/98 |
| 6,849,932 B2 * | 2/2005 | Tsai et al. | .................... | 257/675 |
| 6,864,586 B2 * | 3/2005 | Hsieh et al. | ................. | 257/780 |
| 6,921,975 B2 * | 7/2005 | Leal et al. | .................... | 257/723 |
| 6,965,157 B1 * | 11/2005 | Perez et al. | ................. | 257/666 |
| 6,969,640 B1 * | 11/2005 | Dimaano, Jr. et al. | ........ | 438/122 |
| 7,078,788 B2 * | 7/2006 | Vu et al. | ...................... | 257/668 |
| 7,091,594 B1 * | 8/2006 | Kim et al. | .................... | 257/687 |
| 7,109,574 B2 * | 9/2006 | Chiu et al. | ................... | 257/684 |
| 7,115,441 B2 * | 10/2006 | Choi, III | ...................... | 438/109 |

(Continued)

*Primary Examiner*—N Drew Richards
*Assistant Examiner*—Ankush k Singal
(74) *Attorney, Agent, or Firm*—Jianq Chyun IP Office

(57) ABSTRACT

A method for manufacturing a light emitting chip package includes bonding a patterned metal plate having at least a thermal enhanced plate and many contacts around the same to a substrate and bonding a film-like circuit layer to the patterned metal plate. Many conductive wires are formed to connect the film-like circuit layer and the contacts. Thereafter, at least a first molding is formed on the substrate to encapsulate the patterned metal plate, the conductive wires and a portion of the film-like circuit layer. At least one light emitting chip disposed on the film-like circuit layer exposed by the first molding has many bumps to which the light emitting chip and the film-like circuit layer are electrically connected. A cutting process is performed to form at least one light emitting chip package, and the substrate is removed. Therefore, heat dissipation efficiency of the light emitting chip package can be improved.

13 Claims, 5 Drawing Sheets

U.S. PATENT DOCUMENTS

| | | | |
|---|---|---|---|
| 7,247,509 B2 * | 7/2007 | Yamauchi et al. | 438/33 |
| 7,273,765 B2 * | 9/2007 | Minamio et al. | 438/68 |
| 7,358,598 B2 * | 4/2008 | Diot et al. | 257/666 |
| 7,425,464 B2 * | 9/2008 | Fay et al. | 438/107 |
| 2002/0027010 A1 * | 3/2002 | Glenn | 174/52.2 |
| 2002/0168798 A1 * | 11/2002 | Glenn et al. | 438/110 |
| 2003/0075792 A1 * | 4/2003 | Ruhland | 257/693 |
| 2003/0168254 A1 * | 9/2003 | Kariya et al. | 174/261 |
| 2003/0170922 A1 * | 9/2003 | Sakamoto et al. | 438/22 |
| 2003/0173663 A1 * | 9/2003 | Kami et al. | 257/728 |
| 2004/0000727 A1 * | 1/2004 | Hsu | 257/787 |
| 2004/0046242 A1 * | 3/2004 | Asakawa | 257/678 |
| 2004/0089922 A1 * | 5/2004 | Gerber et al. | 257/668 |
| 2004/0090161 A1 * | 5/2004 | Noguchi et al. | 313/152 |
| 2004/0150335 A1 * | 8/2004 | Horiuchi et al. | 313/512 |
| 2005/0035357 A1 * | 2/2005 | Fjelstad | 257/81 |
| 2005/0151147 A1 * | 7/2005 | Izuno et al. | 257/98 |
| 2005/0280017 A1 * | 12/2005 | Oshio et al. | 257/99 |
| 2006/0027828 A1 * | 2/2006 | Kikuchi | 257/99 |
| 2006/0076671 A1 * | 4/2006 | Kariya et al. | 257/702 |
| 2006/0084191 A1 * | 4/2006 | Hwan | 438/17 |
| 2006/0125075 A1 * | 6/2006 | Liao et al. | 257/690 |
| 2006/0208271 A1 * | 9/2006 | Kim et al. | 257/100 |
| 2006/0220050 A1 * | 10/2006 | Higaki et al. | 257/99 |
| 2007/0048901 A1 * | 3/2007 | Hwan | 438/108 |
| 2007/0081314 A1 * | 4/2007 | Nakatani | 361/783 |
| 2007/0131940 A1 * | 6/2007 | Wu et al. | 257/79 |
| 2007/0145401 A1 * | 6/2007 | Ikehara | 257/98 |
| 2007/0161316 A1 * | 7/2007 | Taguchi et al. | 445/25 |
| 2007/0170454 A1 * | 7/2007 | Andrews | 257/100 |
| 2007/0290329 A1 * | 12/2007 | Murayama et al. | 257/704 |
| 2008/0021136 A1 * | 1/2008 | Kashiwagi et al. | 524/101 |
| 2008/0274593 A1 * | 11/2008 | Yang et al. | 438/113 |

* cited by examiner

LIGHT EMITTING CHIP PACKAGE AND MANUFACTURING METHOD THEREOF

CROSS-REFERENCE TO RELATED APPLICATION

This application claims the priority benefit of Taiwan application serial no. 95139151, filed Oct. 24, 2006. All disclosure of the Taiwan application is incorporated herein by reference.

BACKGROUND OF THE INVENTION

1. Field of the Invention

The present invention relates to a light-source module, and more particularly to a light-source module employing a light emitting chip package.

2. Description of Related Art

In the recent years, light emitting diode (LED) devices adopting GaN-containing compound semiconductors such as GaN, AlGaN, InGaN, etc are rather prominent. The III nitride materials have a broad band-gap, and a light wavelength thereof includes almost all wavebands of visible lights, such as an ultraviolet light, a red light, and so on. Moreover, in comparison with conventional bulbs, the LEDs have absolute attributes. For example, an LED is physically compact, long lasting, low voltage/current driven, durable, mercury free (pollution free), highly emissive (power saving), and so forth. Therefore, the LEDs can be applied in a wide variety of fields.

Because the light emitted from the LED is a type of cold emission rather than a thermal emission or an electric discharge, the service life of an LED device often exceeds a hundred thousand hours, and no idling time is required. In addition, the LED devices have advantages of high responsive speed (about $10^{-9}$ seconds) on the premise of efficient heat dissipation, small volume, little consumption of electricity, low degree of pollution (no mercury contained), great reliability, adaptation of mass production, and so on. Thus, the applications of the LEDs are quite extensive, and the LEDs are deemed the most important light sources in the $21^{st}$ century.

However, a great deal of heat may be generated during the operation of the LEDs, and the luminance and the working life of the LEDs are both subject to temperature changes. Accordingly, with the increase in the light emitting efficiency of the LEDs, demands for better heat dissipation are raised. Conventionally, complicated heat dissipation systems are utilized according to the related art, which results in an excessive volume of the device and higher manufacturing costs.

SUMMARY OF THE INVENTION

In view of the foregoing, the present invention is directed to a method for manufacturing a light emitting chip package with a longer service life.

The present invention is further directed to a light emitting chip package for enhancing the efficiency of heat dissipation.

The present invention provides a method of manufacturing the light emitting chip package. The method includes the following steps. First, a patterned metal plate and a substrate are bonded. The patterned metal plate includes at least one thermal enhanced plate and a plurality of contacts around the thermal enhanced plate. A film-like circuit layer and the patterned metal plate are then bonded. Next, a plurality of conductive wires is formed to connect the film-like circuit layer and the contacts. Thereafter, at least one first molding is formed on the substrate to encapsulate the patterned metal plate, the conductive wires and a portion of the film-like circuit layer. At least one light emitting chip is disposed on the film-like circuit layer exposed by the first molding. The light emitting chip has a plurality of bumps, and the light emitting chip and the film-like circuit layer are electrically connected to the bumps. After that, a cutting process is then performed to form at least one light emitting chip package. Eternally, the substrate is removed.

According to one embodiment of the present invention, the method for manufacturing the light emitting chip package further includes forming an underfill to encapsulate the bumps after the light emitting chip is disposed.

According to one embodiment of the present invention, the method for manufacturing the light emitting chip package further includes forming a second molding on the film-like circuit layer exposed by the first molding to encapsulate the light emitting chip after the underfill is formed.

According to one embodiment of the present invention, the method for manufacturing the light emitting chip package further includes forming a second molding on the film-like circuit layer exposed by the first molding to encapsulate the light emitting chip after the light emitting chip is disposed.

According to one embodiment of the present invention, the step of bonding the patterned metal plate to the substrate includes bonding a metal plate to the substrate and performing a patterning process on the metal plate to form the patterned metal plate.

According to one embodiment of the present invention, the step of bonding the film-like circuit layer to the patterned metal layer includes forming an insulating adhesive layer on the thermal enhanced plate and bonding the film-like circuit layer to the patterned metal layer through the insulating adhesive layer.

According to one embodiment of the present invention, the substrate may be a tape.

The present invention further provides a light emitting chip package including a thermal enhanced plate, a plurality of contacts, a film-like circuit layer, a plurality of conductive wires, a first molding and at least a light emitting chip. The contacts are around the thermal enhanced plate. The film-like circuit layer is disposed on and electrically insulated from the thermal enhanced plate. The conductive wires connect the film-like circuit layer and the contacts. The first molding is disposed over the thermal enhanced plate to encapsulate the conductive wires, the contacts and a portion of the film-like circuit layer. Here, the first molding has an opening exposing a portion of the film-like circuit layer. The light emitting chip is disposed on the film-like circuit layer exposed by the opening. Here, the light emitting chip has a plurality of bumps, and the light emitting chip and the film-like circuit layer are electrically connected to the bumps.

According to one embodiment of the present invention, the film-like circuit layer includes a patterned metal layer and a solder mask layer disposed on the patterned metal layer.

According to one embodiment of the present invention, the light emitting chip package further includes an underfill sandwiched between the light emitting chip and the film-like circuit layer to encapsulate the bumps, and the light emitting chip has an active surface and a back surface. Here, the bumps are disposed on the active surface, and the underfill exposes the back surface of the light emitting chip.

According to one embodiment of the present invention, the light emitting chip package further includes a second molding disposed within the opening to encapsulate the light emitting chip and the underfill. Besides, the second molding includes a fluorescent powder.

According to one embodiment of the present invention, the light emitting chip package further includes a second molding disposed within the opening to encapsulate the light emitting chip. Besides, the second molding includes a fluorescent powder.

According to one embodiment of the present invention, the light emitting chip package further includes an insulating adhesive layer disposed between the film-like circuit layer and the thermal enhanced plate. In addition, the insulating adhesive layer is characterized by thermal conductivity.

According to one embodiment of the present invention, the thermal enhanced plate is co-planar with the contacts, and the thermal enhanced plate and the contacts are made of the same material.

According to one embodiment of the present invention, an edge of the first molding is aligned with the edges of the contacts.

According to one embodiment of the present invention, a width of the opening is gradually increased in a direction away from the film-like circuit layer.

According to one embodiment of the present invention, the light emitting chip includes a light emitting diode (LED) or an organic light emitting diode (OLED).

Based on the above, the film-like circuit layer and the metal plate are bonded to carry the light emitting chip according to the present invention. Therefore, the light emitting chip package of the present invention has better heat dissipation efficiency and a longer service life.

In order to the make the aforementioned and other objects, features and advantages of the present invention comprehensible, several embodiments accompanied with figures are described in detail below.

DESCRIPTION OF EMBODIMENTS

Figure 1A:
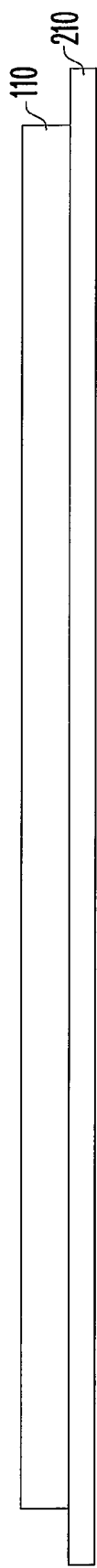
FIGS. 1A through 1H are cross-sectional schematic views showing a method for manufacturing a light emitting chip package according to one embodiment of the present invention.

FIGS. 1A through 1H are cross-sectional schematic views showing a method for manufacturing a light emitting chip package according to one embodiment of the present invention. Referring to FIG. 1A, a metal plate 110 and a substrate 210 are provided at first. The substrate 210 may be a removable temporary carrier, such as a tape or other films which are apt to be separated from the metal plate 110. In addition, a material of the metal plate 110 may be copper, aluminum, or any other metal with a high coefficient of thermal conductivity. Then, the metal plate 110 and the substrate 210 are bonded through an adhesive layer (not shown), for example.

Figure 1B:
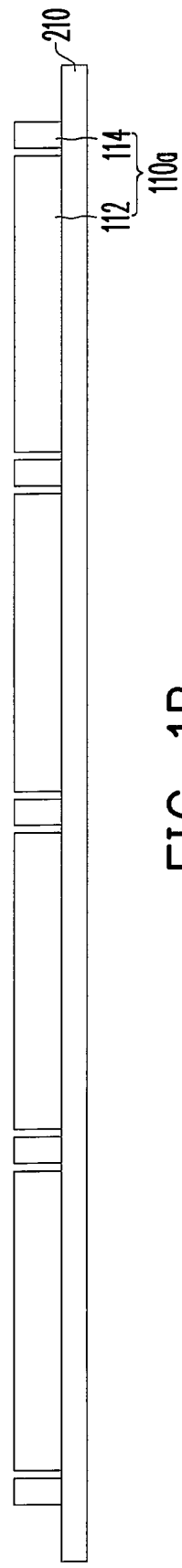

Referring to FIG. 1B, a patterning process is performed on the metal plate 110 to form a patterned metal plate 110a. The patterned metal plate 110a includes a plurality of thermal enhanced plates 112 and a plurality of contacts 114 around each of the thermal enhanced plates 112. However, the number of the thermal enhanced plates 112 is not limited in the present embodiment, and neither is the number of the contacts 114. For example, the number of the thermal enhanced plate may be 1 in the present embodiment. Additionally, the patterning process includes a photolithography process and an etching process. According to the present embodiment, the patterned metal plate 110a is formed by bonding the metal plate 110 to the substrate 210 at first. The patterned metal plate 110a is then formed. However, according to another embodiment, the patterned metal plate 110a can be constituted by directly providing a patterned metal plate 110a and bonding the same to the substrate 210.

Figure 1C:
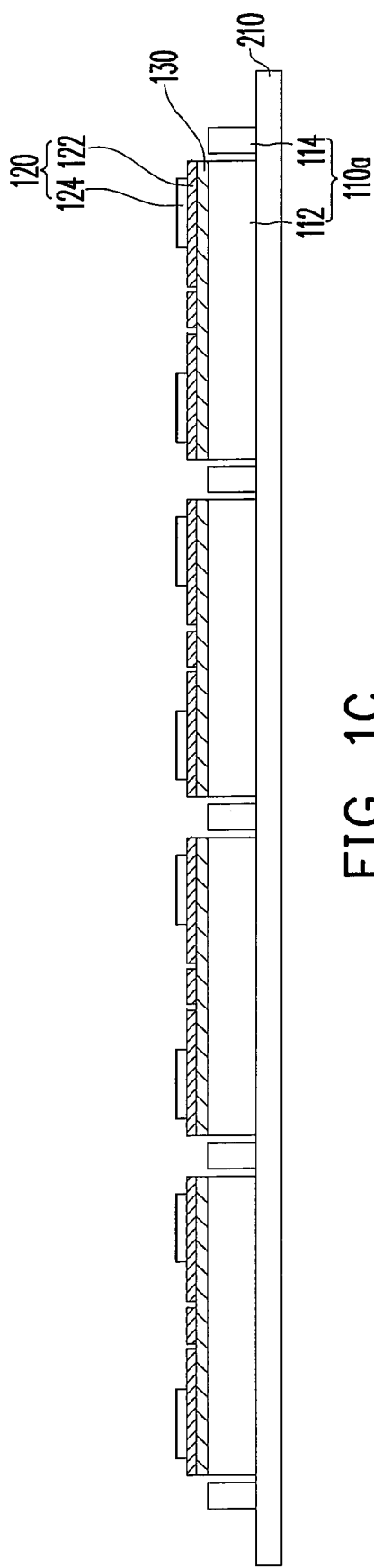

Referring to FIG. 1C, a film-like circuit layer 120 is provided and is bonded to the patterned metal plate 110a. According to the present embodiment, the film-like circuit layer 120 includes a patterned metal layer 122 and a solder mask layer 124 disposed on the patterned metal layer 122. However, it is not limited in the present embodiment that the film-like circuit layer 120 merely has a single-layered circuit. Namely, the film-like circuit layer 120 may have a multi-layered circuit. Besides, as the bottom of the film-like circuit layer 120 is a metal layer, the step of bonding the film-like circuit layer 120 to the patterned metal plate 110a includes forming an insulating adhesive layer 130 on one of the thermal enhanced plate 112. Next, the film-like circuit layer 120 is bonded to the patterned metal plate 110a through the insulating adhesive layer 130. Moreover, as the bottom of the film-like circuit layer 120 is a dielectric layer, the film-like circuit layer 120 can either be directly bonded to the patterned metal plate 110a or be bonded thereto through the insulating adhesive layer 130.

Figure 1D:
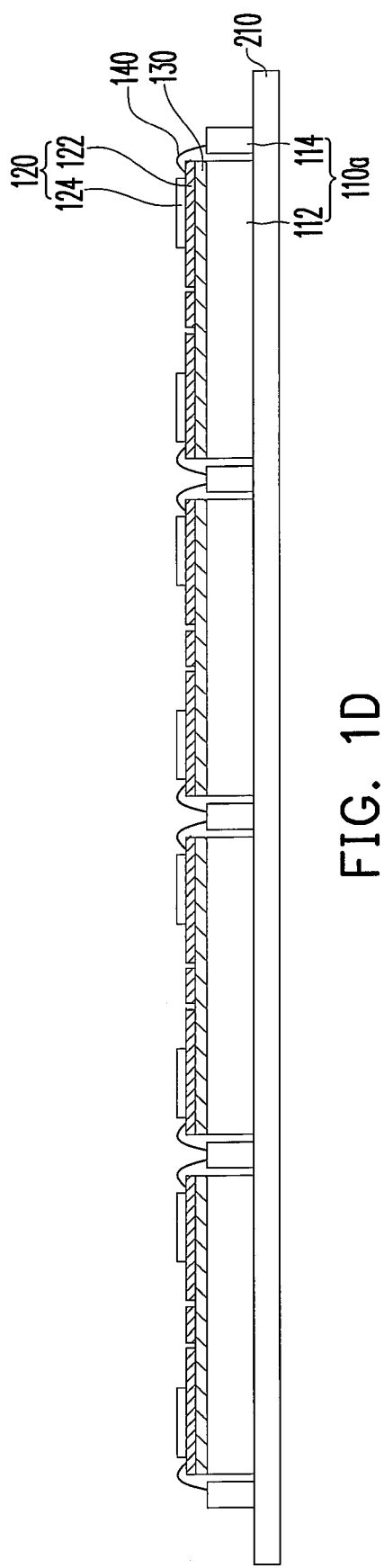

Referring to FIG. 1D, a wire bonding process is carried out to form a plurality of conductive wires 140 connecting the film-like circuit layer 120 and the contacts 114. Additionally, the material of the conductive wires 140 may be gold, copper or any other metal.

Figure 1E:
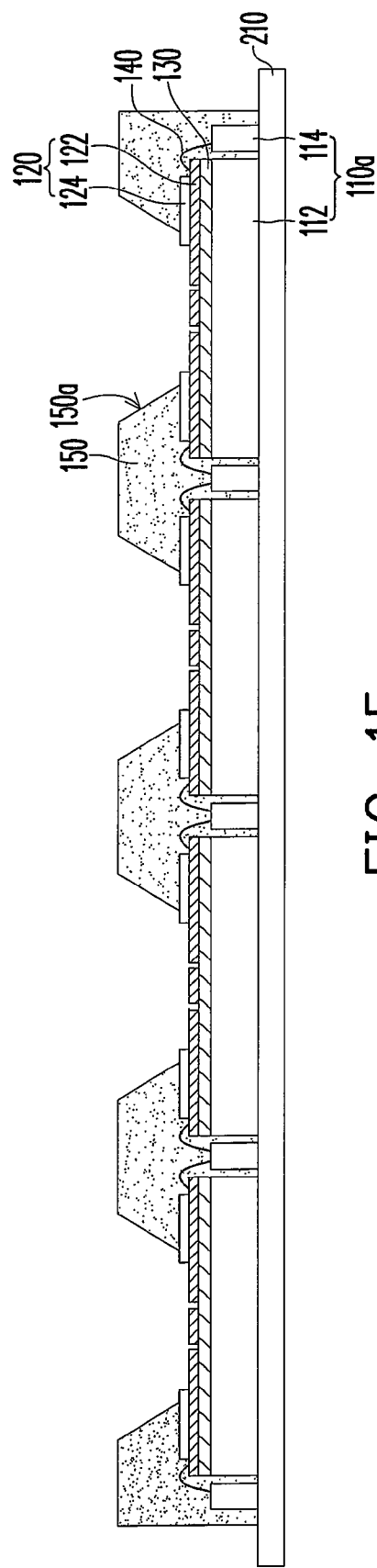

Referring to FIG. 1E, a molding process is implemented to form a first molding 150 on the substrate 210. The first molding 150 encapsulates the patterned metal plate 110a, the conductive wires 140, a portion of the film-like circuit layer 120, and the contacts 114. It should be noted that an opening 150a of the first molding 150 has to expose a portion of the film-like circuit layer 120, such that a light emitting chip 160 can be disposed in succeeding processes. The detailed description will be provided hereinafter. Furthermore, after the first molding 150 is formed, a metal reflective layer (not shown) may also be formed on an inner wall of the opening 150a through an evaporation process, for example, so as to increase the reflectivity rate of the first molding 150.

Figure 1F:
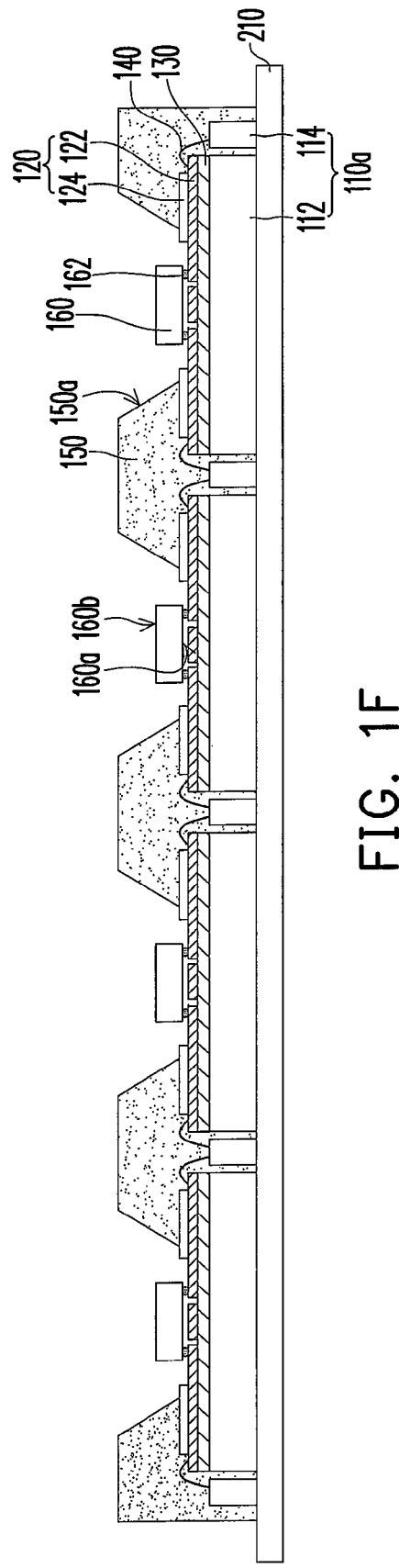

Referring to FIG. 1F, a plurality of the light emitting chips 160 is disposed on the film-like circuit layer 120 exposed by the first molding 150. Each of the light emitting chips 160 has an active surface 160a, a back surface 160b and a plurality of bumps 162. The bumps 162 are disposed on the active surface 160a, and the light emitting chips 160 are electrically connected to the film-like circuit layer 120 via the bumps 162.

Figure 1G:
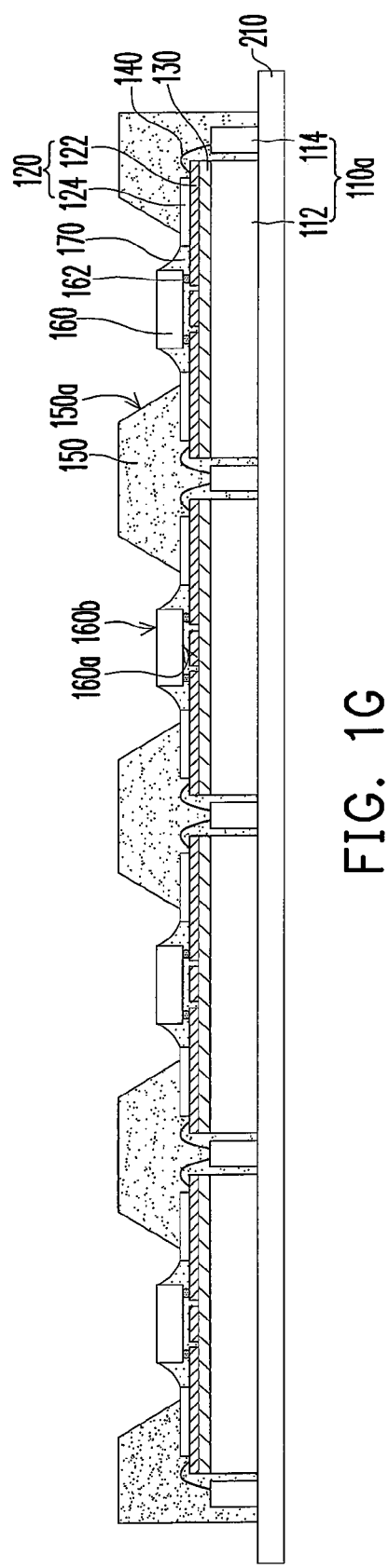

Referring to FIG. 1G, in order to ensure that the bumps 162 and the film-like circuit layer 120 are electrically connected, an underfill 170 may be formed to encapsulate the bumps 162 after one of the light emitting chips 160 is disposed. The underfill 170 may expose the back surface 160b of one of the light emitting chips 160. Besides, after the underfill 170 is formed, a second molding 180 may also be formed on the film-like circuit layer 120 exposed by the first molding 150 to encapsulate the light emitting chip 160. Alternatively, after the light emitting chip 160 is disposed, the second molding 180 may be directly formed without forming the underfill 170.

Figure 1H:
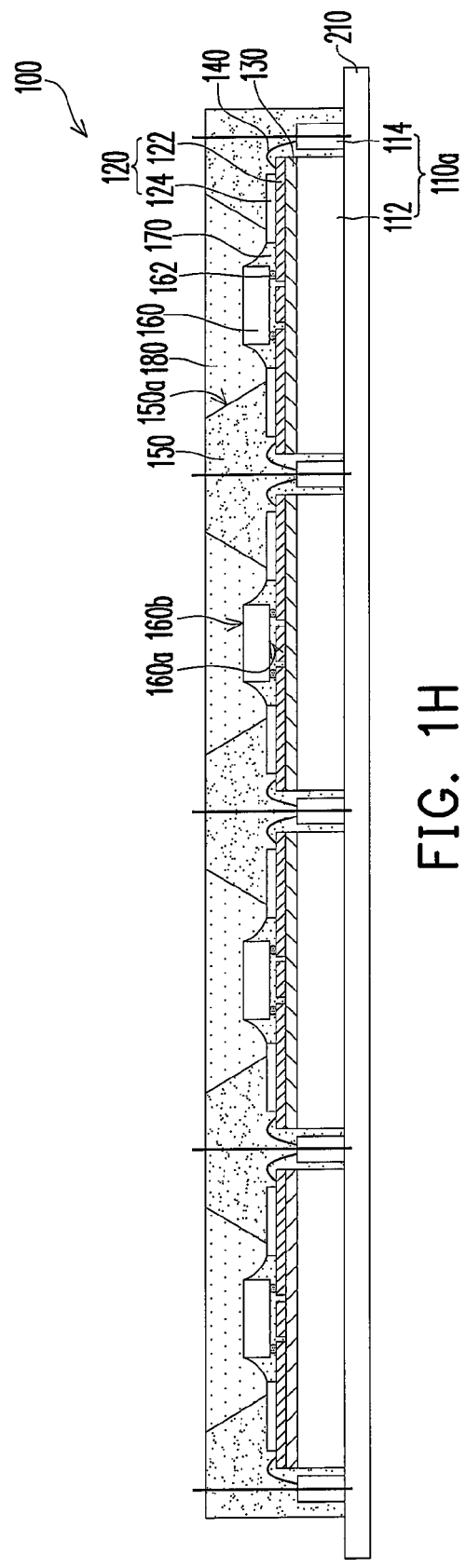

Referring to FIG. 1H, a cutting process is performed on the structure fabricated by said manufacturing process, so as to form a plurality of light emitting chip packages 100. Then, the substrate 210 is removed. Up to here, the fabrication of the light emitting chip package 100 is completed. Note that the cutting process may also be directly performed after the light emitting chip 160 is disposed. As an alternative, the cutting process may be carried out after the underfill 170 is formed or after the disposition of the light emitting chip 160 and the direct formation of the second molding 180. In addition, the structure of the light emitting chip package 100 will be elaborated as follows.

Figure 2:
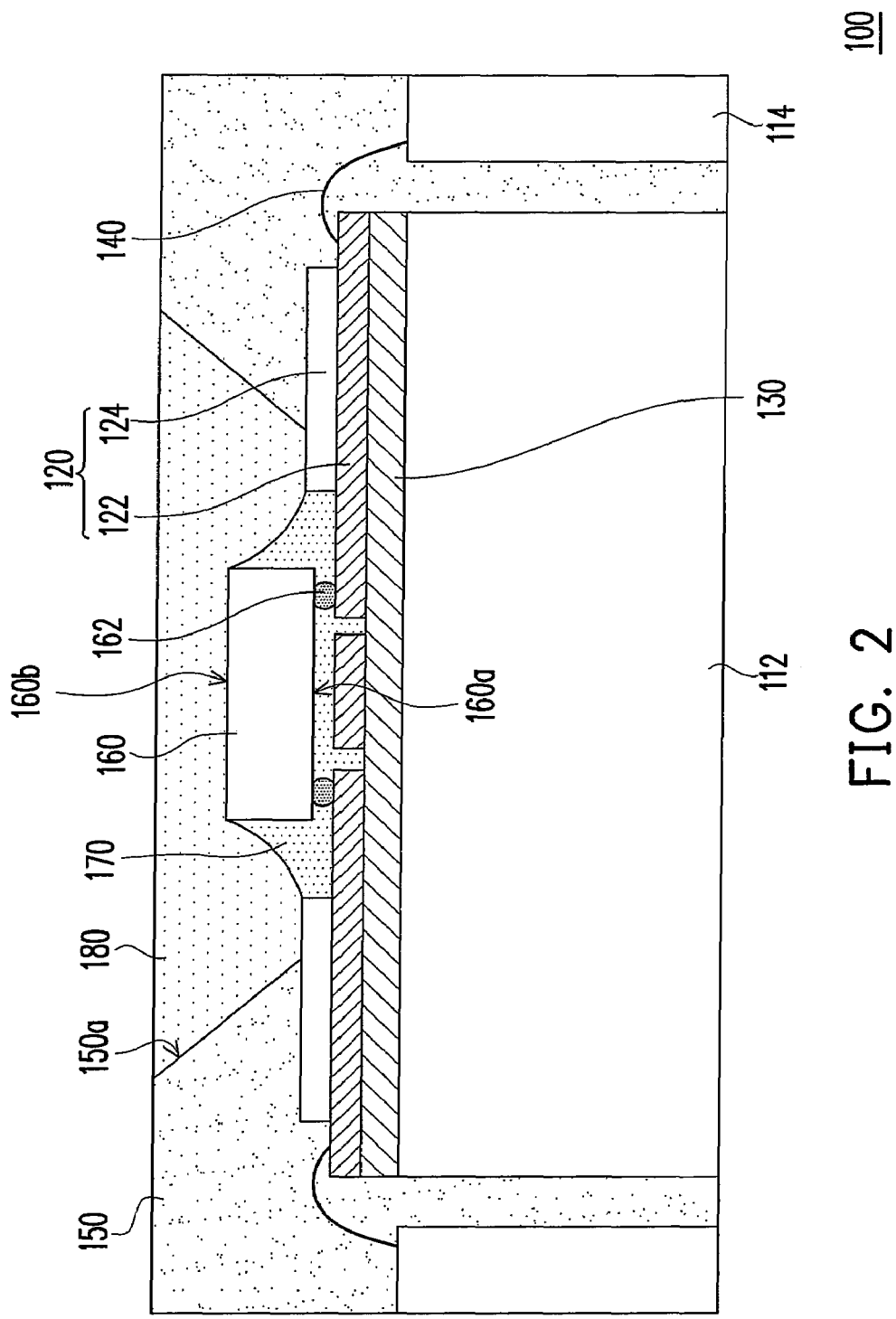
FIG. 2 is a cross-sectional view of a light emitting chip package according to one embodiment of the present invention.

FIG. 2 is a cross-sectional view of a light emitting chip package according to one embodiment of the present invention. Referring to FIG. 2, a light emitting chip package 100 in the present embodiment includes a thermal enhanced plate 112, a plurality of contacts 114, a film-like circuit layer 120, a plurality of conductive wires 140, a first molding 150, and at least a light emitting chip 160. Here, the contacts 114 are around the thermal enhanced plate 112. According to the present embodiment, the thermal enhanced plate 112 and the contacts 114 are formed by the same metal plate. Thus, the thermal enhanced plate 112 is coplanar with the contacts 114, and the thermal enhanced plate 112 and the contacts 114 are made of the same material. Nevertheless, according to another embodiment, there can be a height difference between the thermal enhanced plate 114 and the contacts 114. Moreover, according to another embodiment, the thermal enhanced plate 112 and the contacts 114 can further be made of different materials.

The film-like circuit layer 120 is disposed on and electrically insulated from the thermal enhanced plate 114. According to the present embodiment, the film-like circuit layer 120 includes a patterned metal layer 122 and a solder mask layer 124 disposed on the patterned metal layer 122. However, it is not limited in the present embodiment that the film-like circuit layer 120 merely has a single-layered circuit. Namely, the film-like circuit layer 120 may have a multi-layered circuit.

Besides, as a bottom of the film-like circuit layer 120 is a metal layer, the light emitting chip package 100 further includes an insulating adhesive layer 130 sandwiched between the film-like circuit layer 120 and the thermal enhanced plate 112. However, as the bottom of the film-like circuit layer 120 is a dielectric layer, the film-like circuit layer 120 can either be directly bonded to the patterned metal plate 110a or be bonded thereto through the insulating adhesive layer 130. In addition, the insulating adhesive layer 130 may be characterized by thermal conductivity, which is conducive to conducting heat generated by the light emitting chip 160.

Referring to FIG. 2 again, the conductive wires 140 are connected to the film-like circuit layer 120 and the contacts 114. Additionally, the first molding 150 is disposed over the thermal enhanced plate 112 and encapsulates the conductive wires 140, the contacts 114 and a portion of the film-like circuit layer 120. The first molding 150 has an opening 150a exposing a portion of the film-like circuit layer 120. In the present embodiment, in order to facilitate the use of the light irradiated by the light emitting chip 160, a width of the opening 150a is gradually increased in a direction away from the film-like circuit layer, such that the light irradiated by the light emitting chip 160 can be easily reflected. A metal reflective layer (not shown) may also be formed on an inner wall of the opening 150a, so as to increase the reflectivity rate. Moreover, since the first molding 150 and the contacts 114 are both incised, an edge of the first molding 150 is aligned with the edges of the contacts 114.

The light emitting chip 160 is disposed on the film-like circuit layer 120 exposed by the opening 150a. The light emitting chip 160 has an active surface 160a, a back surface 160b and a plurality of bumps 162. The bumps 162 are disposed on the active surface 160a, and the light emitting chip 160 are electrically connected to the film-like circuit layer 120 via the bumps 162. More specifically, the bumps 162 are electrically connected to the patterned metal layer 122 of the film-like circuit layer 120. It should be noted that the light emitting chip package 100 merely has a single light emitting chip 160 in the present embodiment, while the light emitting chip package 100 may include a plurality of the light emitting chips 160 in another embodiment. In addition, the light emitting chip 160 includes an LED or an OLED.

The light emitting chip package 100 may also include an underfill 170 and/or a second molding 180. The underfill 170 is disposed between the light emitting chip 160 and the film-like circuit layer 120 to encapsulate the bumps 162 and to expose the back surface 160b of the light emitting chip 160. On the other hand, the second molding 180 is disposed within the opening 150a to encapsulate the light emitting chip 160 and the underfill 170. Besides, the second molding 180 is made of a transparent material, and thus the light irradiated by the light emitting chip 160 is capable of passing through the second molding 180.

Note that the second molding 180 may include a fluorescent powder.

In summary, the light emitting chip package and the manufacturing method thereof as provided in the present invention have at least the following advantages:

1. The film-like circuit layer and the substrate featuring great thermal conductivity are bonded together in the present invention. Thereby, heat generated during the operation of the light emitting chip can be conducted to the outside, increasing the service life of the light emitting chip and improving light emission efficiency thereof.

2. The contacts of the light emitting chip package are disposed at the bottom or at the side of the light emitting chip package according to the present invention. Accordingly, the light emitting chip package can be assembled to other electronic devices via a surface mounting technology (SMT) or a plug-in/plug-out method.

3. Given that the second molding and the solder mask layer both composed of appropriate materials are employed, absorption of the light irradiated by the light emitting chip can be reduced.

4. Since the light emitting chip is electrically connected to the film-like circuit layer through a flip chip bonding process, the light irradiated by the light emitting chip is relatively not apt to suffer from the interference caused by other components.

Although the present invention has been disclosed above by the embodiments, they are not intended to limit the present invention. Anybody skilled in the art can make some modifications and alteration without departing from the spirit and scope of the present invention. Therefore, the protecting range of the present invention falls in the appended claims.

What is claimed is:

1. A light emitting chip package, comprising:
a thermal enhanced plate;
a plurality of contacts disposed around the thermal enhanced plate;
a film-like circuit layer disposed on and electrically insulated from the thermal enhanced plate;
a plurality of conductive wires connecting the film-like circuit layer and the contacts;
a first molding disposed over the thermal enhanced plate to encapsulate the conductive wires, the contacts and a portion of the film-like circuit layer, wherein the first molding has an opening exposing a portion of the film-like circuit layer; and
at least a light emitting chip disposed on the film-like circuit layer exposed by the opening, wherein the light emitting chip has a plurality of bumps, and the light emitting chip and the film-like circuit layer are electrically connected to the bumps.

2. The light emitting chip package as claimed in claim 1, wherein the film-like circuit layer comprises a patterned metal layer and a solder mask layer disposed on the patterned metal layer.

3. The light emitting chip package as claimed in claim 1, further comprising an underfill sandwiched between the light emitting chip and the film-like circuit layer to encapsulate the bumps, wherein the light emitting chip has an active surface and a back surface, the bumps are disposed on the active surface, and the underfill exposes the back surface.

4. The light emitting chip package as claimed in claim 1, further comprising a second molding disposed within the opening to encapsulate the light emitting chip.

5. The light emitting chip package as claimed in claim 1, further comprising an insulating adhesive layer disposed between the film-like circuit layer and the thermal enhanced plate.

6. The light emitting chip package as claimed in claim 1, wherein the thermal enhanced plate is co-planar with the contacts, and the thermal enhanced plate and the contacts are made of the same material.

7. The light emitting chip package as claimed in claim 1, wherein an edge of the first molding is aligned with the edges of the contacts.

8. The light emitting chip package as claimed in claim 1, wherein a width of the opening is gradually increased in a direction away from the film-like circuit layer.

9. The light emitting chip package as claimed in claim 1, wherein the light emitting chip comprises a light emitting diode (LED) or an organic light emitting diode (OLED).

10. The light emitting chip package as claimed in claim 3, further comprising a second molding disposed within the opening to encapsulate the light emitting chip and the underfill.

11. The light emitting chip package as claimed in claim 10, wherein the second molding comprises a fluorescent powder.

12. The light emitting chip package as claimed in claim 4, wherein the second molding comprises a fluorescent powder.

13. The light emitting chip package as claimed in claim 5, wherein the insulating adhesive layer is characterized by thermal conductivity.

* * * * *